United States Patent [19]

Henry et al.

[11] Patent Number: 4,952,017
[45] Date of Patent: Aug. 28, 1990

[54] POLARIZATION INDEPENDENT SEMICONDUCTOR OPTICAL AMPLIFIER

[75] Inventors: Charles H. Henry, Skillman; Rudolf F. Kazarinov, Martinsville; Nils A. Olsson, Gillette, all of N.J.

[73] Assignee: AT&T Bell Laboratories, Murray Hill, N.J.

[21] Appl. No.: 323,462

[22] Filed: Mar. 14, 1989

[51] Int. Cl.$^5$ .................... G02B 6/26; H03F 3/04; H01S 3/098; H01L 29/66

[52] U.S. Cl. .................... 350/96.15; 330/250; 372/19; 357/55

[58] Field of Search ........... 350/96.15, 96.16, 96.20, 350/96.21; 330/4.3, 250; 372/19, 703; 357/55, 73

[56] References Cited

U.S. PATENT DOCUMENTS 4,625,225 11/1986 Goodfellow et al. ............ 357/55 X
4,772,787 9/1988 Trommer .................... 350/96.15 X

OTHER PUBLICATIONS

IEE Proc., vol. 129, Pt. I, No. 6, Dec. 1982, "Formation of a Long-Wavelength Buried-Cresent Laser Structure on Channelled Substrates", D. L. Murrell et al., pp. 209–213.
Electronics Letters, vol. 24, No. 17, Aug. 18, 1988, "Polarisation-Independent Configuration Optical Amplifier," N. A. Olsson, pp. 1075–1076.
Electronics Letters, vol. 23, 1987, "Optical Amplifier Configurations with Low Polarization Sensitivity," G. Grosskopf et al., pp. 1387–1388.
IEEE Journal of Quantum Electronics, vol. QE-19, No. 6, Jun. 1983, "Distributed Feedback InGaAsP/InP Lasers with Window Region Emitting at 1.5 μm Range", by Shigeyuki Akiba, Katsuyuki Utaka, K. Sakai and Y. Matsushima, pp. 1052–1056.
Journal of Optical Communications, vol. 4, No. 2, Jun. 1983, "Semiconductor Laser Amplifier for Single Mode Optical Fiber Communications," J. C. Simon, pp. 51–62.

Primary Examiner—John D. Lee
Assistant Examiner—Akm E. Ullah
Attorney, Agent, or Firm—David I. Caplan

[57] ABSTRACT

In a fiber-optic communication system, a polarization independent semiconductor optical amplifier structure is achieved by tailoring the height-width aspect ratio of its active region to a value at least close to unity and at the same time using a laser cavity structure in which the end mirrors are buried in the semiconductor body in which the optical amplifier structure is built.

10 Claims, 2 Drawing Sheets

POLARIZATION INDEPENDENT SEMICONDUCTOR OPTICAL AMPLIFIER

FIELD OF THE INVENTION

This invention relates to fiber optic communication systems and more particularly to such systems which utilize one or more semiconductor optical amplifiers located along the fiber optic transmission paths.

BACKGROUND OF THE INVENTION

In a fiber optic communication system, a light wave is supplied to an input end of an optical fiber for propagation through the fiber. Regardless of the optical polarization of the wave at the input end of the fiber, by the time the wave reaches an output end of the fiber the polarization is random (unpredictable and uncontrollable). That is, the polarization of the light as it reaches the output end of the fiber in general will be randomly different from that at the input end thereof. This randomization of polarization is the result of randomly variable physical phenomena, such as birefringence due to mechanical strains in the fiber, that modify the optical polarization of light propagating through fiber. Accordingly, any optical amplifier device for amplifying the light exiting from the output end of the fiber should be capable of amplifying with equal gain any optical polarization; that is, the optical gain of the amplifier should be independent of the polarization, for otherwise the intensity of the light emanating from the amplifier will be undesirably randomly variable, as well as undesirably low in those cases where the light exiting from the fiber has a polarization for which the optical gain of the amplifier is low relative to its gain for the other polarization(s).

It is, of course, well known that any optical polarization can be viewed as a linear combination (a sum) of just two independent polarizations, such as TE and TM (transverse electric and transverse magnetic) waves, with a phase difference between them which may vary with time. Thus, an optical amplifier that has equal gain for just two independent polarizations will have equal gain for all polarizations.

In prior art, semiconductor laser (optical oscillator) structures have been proposed for use as optical amplifiers. A major problem with the resulting semiconductor optical amplifiers is an undesirable difference in optical gain for different polarizations: a semiconductor optical amplifier typically has a difference of several dB (decibels) in gain between TE and TM input waves. A typical semiconductor laser structure, with an active layer whose (rectangular) cross section is very non-symmetric, for example, about 0.15 $\mu$m (micrometer) thick and about 2 $\mu$m wide, has significantly different confinement factors—i.e., different fractions of optical energy confined to the active region, where optical amplification occurs—equal to about 0.4 for TE and 0.2 for TM waves having a wavelength equal to about 1.3 $\mu$m. Hence, in general, a semiconductor optical amplifier whose structure is the same as that of the laser (optical oscillator) has undesirably different optical gains for TE and TM waves—for example, at least twice (0.4/0.2) the gain (3 dB) for TE than for TM waves in the case of the typical semiconductor optical amplifier structure for 1.3 $\mu$m wavelength. Moreover, because of the difference in the indices of refraction between TE and TM waves, the optical reflectivity of the facets (end faces) of a semiconductor optical amplifier structure significantly depends upon the optical polarization of the light which is being reflected, whereby the difference between the optical gains for TE and TM waves can be undesirably increased.

In order to mitigate this problem, semiconductor optical amplifier devices have been proposed which involve the use of two optical amplifiers structures, in which the polarization dependence of one of the structures is undone (compensated) by that of the other, or which involve the use of a single laser amplifier structure in a double-pass configuration. These devices respectively are taught in a paper authored by G. Grosskopf et al, entitled "Optical Amplifier Configurations with Low Polarization Sensitivity," published in *Electronics Letters*, Vol. 23, pp. 1387–1388 (1987), and in a paper authored by N. A. Olsson, one of the inventors herein, entitled "A Polarization Independent Configuration Optical Amplifier," published in *Electronic Letters*, Vol. 24, pp. 1075–1076 (1988). However, the use of the two structures, although feasible, requires two semiconductor chips and hence would be undesirably costly because of its structural complexity; and the use of the double-pass configuration, although feasible, requires tight (careful marginal) control over the reflectivities of anti-reflection ("AR") coatings on the various elements of the configuration and hence likewise would be undesirably costly because of its complexity. Therefore there is a need for a polarization independent semiconductor optical amplifier device structure that is more compact than those of prior art and that does not require as tight control over the reflectivities of AR coatings.

SUMMARY OF THE INVENTION

In a fiber optic communication system, a polarization independent semiconductor optical amplifier device structure, which is more compact and which requires significantly less tight control over reflectivities of AR coatings (if any), is achieved by means of a semiconductor optical amplifier structure containing an active region having a cross section whose (maximum) width and (maximum) height differ from each other by a factor of less than 2, the active region having optical input and output ends that are buried in the body. By the phrase "ends that are buried in the body" it is meant that each of the active region's mutually opposite longitudinal extremities (input and output ends) terminates within the body at a distance x of separation from the correspondingly mutually opposed facets (smooth end surfaces) of the body, where x is equal to at least about ten, preferably at least about thirty, wavelengths (as measured in the body) of the light to be amplified by the structure. In addition, both facets of the body advantageously can be coated with conventional AR coatings, in order to achieve a desirably low optical reflectivity and hence a desirably small optical feedback into the active region; for such optical feedback, if large, could cause optical oscillations that undesirably would reduce optical gain and bandwidth.

The purpose of burying the ends of the active region at the aforementioned distance x from the respective facets of the body is to avoid undesirable polarization-dependent optical feedback into the active region from the strongly polarization dependent reflections at the facets of the body; for such feedback would result in undesirably strongly polarization dependent gain. It has been found, moreover, that reflections from AR coating tends to be so different for TE as compared with TM waves that the AR coatings on the facets of the semiconductor body do not eliminate the need for burying the ends of the active region at the aforementioned distance x from the facets of the body.

The purpose of having the width and height of the cross section of the active region in this invention differ by a factor of less than 2 is to reduce the quantitative extent of non-symmetry in the cross section of active region, whereby the disparity in the confinement factors for TE and TM waves is desirably reduced and hence the disparity in the gain for TE and TM waves likewise is desirably reduced.

BRIEF DESCRIPTION OF THE DRAWING

This invention, together with its features and advantages, may be better understood from the following detailed description when read in conjunction with the drawings in which.

Only for the sake of clarity, none of the drawings is drawn to any scale. Elements which are the same in different Figures are denoted by the same reference numerals.

DETAILED DESCRIPTION

Figure 1:
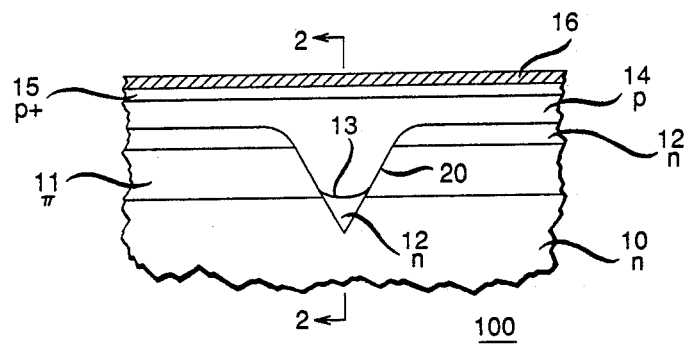
FIG. 1 is a cross-section diagram of a semiconductor optical amplifier structure, taken perpendicular to the direction of optical propagation, in accordance with a specific embodiment of the invention.
Figure 2:
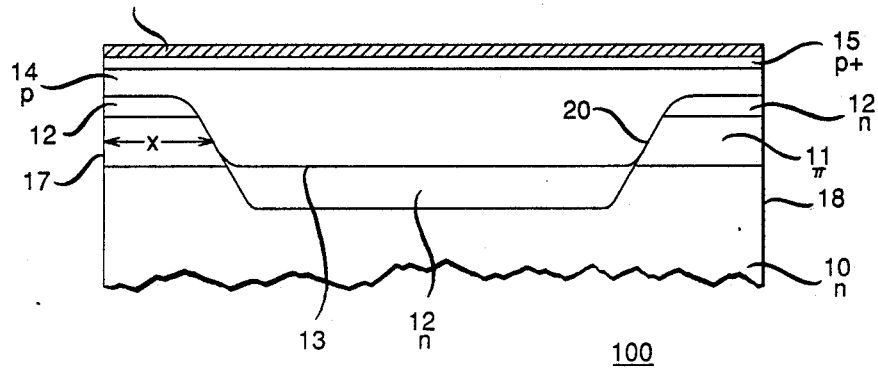
FIG. 2 is a cross-section diagram taken along the direction 2—2 of FIG. 1.

With reference to FIGS. 1 and 2, a semiconductor optical amplifier structure 100 in accordance with a specific embodiment is designed to amplify light having a wavelength of about 1.3 $\mu$m. The structure 100 includes an n+-type InP (indium phosphide) body 10 upon whose top major surfaces, typically oriented (100), has been grown—typically by a known organometal vapor phase epitaxial process—a semi-insulating ($\pi$-type) Fe (iron) doped InP layer 11 having a thickness of typically about 4 $\mu$m and containing a V-groove 20. The V-groove 20 is formed typically in the [110] direction by masking the top surface of the layer semi-insulating layer 11 and etching through the layer 11 and part-way through the body 10, so that a distance x (typically about 7 to 25 $\mu$m) of separation remains between the smooth sides (facets) 17 and 18 of the semi-insulating InP layer 11 and the V-groove 20, as more fully explained below.

In the V-groove 20 (and on the top surface of the semi-insulating InP layer 11) is located an epitaxially grown active layer 12 typically composed of a quaternary compound of n-type InGaAsP (indium gallium arsenide phosphide) doped with tellurium. The relative composition of the constituent elements of the active layer 12 are selected so that it has a bandgap energy corresponding (through Planck's constant) to the wavelength of the light to be amplified by the structure 100, i.e., a wavelength of about 1.3 $\mu$m measured in vacuum.

Upon the active layer 12, both inside and outside of the V-groove 20, is located a (p-n) junction p-type layer 14, typically p-type InP doped with zinc. In the V-groove 20, a p-n junction 13 is thus formed at the interface of the junction layer 14 and the active layer 12, which is useful for injecting holes into the active region 12 during operation. Upon this junction layer 14 is located an epitaxial capping layer 15, typically p+-type InGaAs having a bandgap corresponding to a wavelength of about 1.65 $\mu$m; and upon this capping layer 15 is located a metal electrode layer 16, typically a composite layer of gold, berylium, titanium, platinum, and gold, respectively, from bottom to top.

The thickness of the active layer 12 in the V-groove 20 is typically in the approximate range of 0.8 $\mu$m to 1.0 $\mu$m, whereby the thickness of the active 12 on the flat portion of the surface (away from the V-groove 20) of the semi-insulating layer 11 is about 0.15 $\mu$m. The thickness of the junction layer 14 is typically about 1 $\mu$m as measured on the flat portion (away from the V-groove 20) of the active layer 12; and the thickness of the capping layer 15 is typically about 0.7 $\mu$m.

Facets 17 and 18 of the body 100 are formed typically by conventional cleaving of a large wafer containing many similar optical amplifier structures and are then coated with AR coatings (not shown), whereby optical losses due to reflections are minimized. Note that any optical reflections occurring at interface of the active layer 12 (at its longitudinal extremities) and the semi-insulating layer 11 is desirably directed out of the optical waveguide path between the facets 17 and 18 because of the non-perpendicular orientation of the (sloping) ends of the V-groove (FIG. 2) with respect to the optical path.

The active layer 12, the junction layer 14, and the capping layer 15 can all be grown by known liquid phase epitaxial techniques. A standard metal "ground" electrode (not shown) is attached to the bottom surface (not shown) of the body 10. The body 10 typically has a length parallel to the x direction (FIG. 2) in the range of about 300 to 1000 $\mu$m, typically about 750 $\mu$m, and a width of typically half as much as its length.

During operation, with a drive current in the approximate range of 100 to 250 milliamperes applied from the top electrode to the bottom electrode, a typical device made in accordance with the above described parameters achieved an equality of gain for TE and TM waves of 1.3 $\mu$m wavelength. By "equality" it is meant that the gains were measured to the equal within the uncertainty of the measurements, namely, within about 1 dB.

The portion of the active layer 12 located in the V-groove 20 serves as the optical amplifying region ("active region"). It should be noted that this region has a cross section which is approximately an equilateral triangle, the apex angle of the V-groove being about 54°.7. The symmetries of an equilateral triangle are responsible for the polarization independence of the optical gain of the amplifier structure 100.

Figure 3:
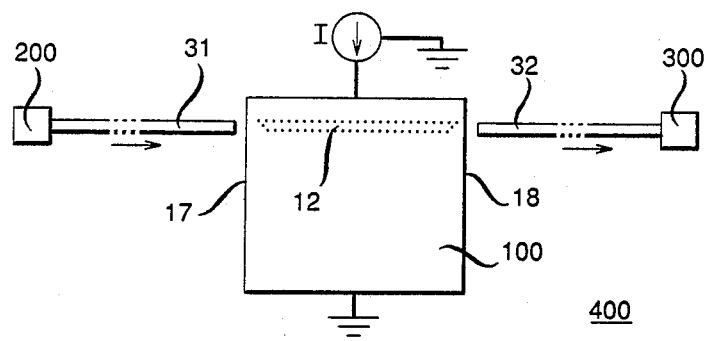
FIG. 3 is a schematic diagram of a fiber optic communication system using the amplifier structure shown in FIG. 1.

Referring to FIG. 3, a fiber optic communication system 400 includes the previously described semiconductor optical amplifier structure 100 with its active layer 12, connected to a current drive source I. The system 400 also includes another optical amplifier 300 typically having the same structure as that of the amplifier structure 100. An optical source 200 is located at a first location remote from the amplifier 100, and it generates an optical carrier wave modulated by a signal, as known in the art. A first optical fiber 31 is positioned for propagating light from the signal-modulated optical source 200 to the left-hand facet 17 of the amplifier structure 100 at a position thereof aligned with the left-hand end of the active region of the layer 12. Typically the optical source 200 is a laser oscillator comprising a semiconductor structure similar to that of the optical amplifier 100.

The right-hand end of the fiber 31 typically has a spherical surface for optical coupling purposes as known in the art.

A second optical fiber 32 is positioned for propagating the light exiting from the right-hand edge 18 of the body 100 to another optical amplifier 300 at a second remote location. The left-hand end of the second fiber 32 also typically has a spherical surface for optical coupling purposes. The optical amplifier 300 delivers its optical output to yet another fiber (not shown) for further optical propagation.

Alternatively, the element labeled 300 can be an optical detector which converts optical radiation emanating from the second fiber 32 into electrical current for utilization of the signal carried by the optical wave.

The first and second fibers 31 and 32 are typically standard silica fibers.

Figure 4:
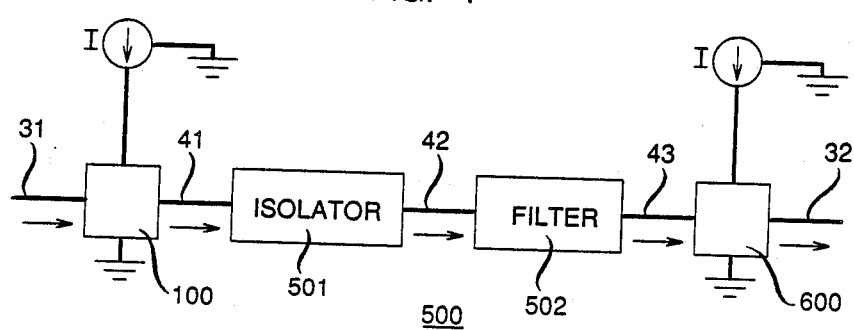
FIG. 4 is a schematic diagram of a portion of a fiber optic communication system using a pair of amplifier structures, each as shown in FIG. 1.

Referring to FIG. 4, an optical amplification station 500 is part of a fiber optic communication system (not shown). The station 500 includes the semiconductor optical amplifier 100, an optical filter 501, an optical isolator (uni-directional optical transmitter) 502, and another semiconductor optical amplifier 600 having a structure which is typically substantially identical to the structure of the semiconductor optical amplifier 100. The fibers 31 and 32 are connected at their left-hand and right-hand ends, respectively, to the rest of the system (not shown) in the same way as shown in FIG. 3. Auxiliary optical fibers 41, 42, and 43, respectively, optically couples the amplifier 100 to the filter 501, the filter 501 to the isolator 502, and the isolator 502 to the optical amplifier 600, respectively.

The optical filter 501 advantageously is a band-pass filter, as known in the art, designed to pass only a relatively narrow band of optical wavelengths centered at a single communication channel wavelength, i.e., the wavelength of the optical carrier wave which is being modulated, as known in the art, by the signal. Alternatively, in cases of wavelength division multiplexing, for example, the filter 501 is designed to pass a plurality of relatively narrow bands $B_1$, $B_2$, etc. of wavelengths $\lambda_1$, $\lambda_2$, etc., respectively, with each band $B_i$ ($i = 1, 2, \ldots$) being centered at a separate one of the corresponding channel wavelengths $\lambda_i$. Each band $B_i$ typically has a width of about 0.5 m $\mu$m to 2 m $\mu$m (5 Angstrom to 20 Angstrom).

The optical isolator 502 is a uni-directional optical transmitter, designed to transmit the band(s) passed by the filter 501 from left to right, i.e., from the fiber 42 to the fiber 43, as known in the art.

In this way the light arriving on the fiber 31 is amplified with polarization independent gains by the semiconductor optical amplifiers 100 and 600 with a minimum of unwanted optical feedback between these amplifiers.

Instead of the auxiliary fibers 41, 42, and 43, optical lenses can be used for focusing the optical waves, as known in the art.

Although the invention has been described in terms of a specific embodiment, various modifications can be made without departing from the scope of the invention. For example, other indium phosphide based, and other semiconductor based, optical amplifier structures can be used in conjunction either with the same or with other optical wavelength(s) relative to 1.3 $\mu$m, such as 1.5 $\mu$m ordinarily in conjunction with an anti-meltback layer, such as InGaAsP having a bandgap wavelength of 1.3 $\mu$m, located upon the active layer 12. Such an anti-meltback layer is typically p-type InGaAsP, doped with Zn (zinc), having a thickness of about 0.10 $\mu$m in the V-groove 20 and about 0.05 $\mu$m on the flat portion of the surface of the active layer 12 away from the V-groove. The thickness of the anti-meltback layer is typically about 0.10 $\mu$m in the V-groove corresponding to about 0.05 $\mu$m on the flat portion of the surface of the active layer 12 outside the V-groove.

Also, a buffer layer (not shown) of epitaxially grown n-type InP doped with zinc can be inserted, if need for reducing heterojunction interface defects, between the active layer 12 and the underlying portions of the surface of the body 10 in the V-groove, as well as between the active layer 12 and the underlying portions (if any) of the surface of the semi-insulating layer 11 located at the flat portion of the surface thereof and in the V-groove. Preferably the thickness of this (optional) buffer layer is selected such that (which will depend upon the apex angle of the V-groove) the average width of the active layer 12 is at least approximately equal to its thickness. However, this average width of the active layer 12 can still advantageously be as much as about two or three times greater than its thickness. The buffer layer can be expected to improve device lifetime, perhaps at some sacrifice of geometric symmetry and hence of polarization independence.

Moreover, the invention can be practiced in conjunction with mesas instead of V-grooves and thus with square rather than equilateral triangular active regions.

We claim:

1. A semiconductor optical amplifier structure, buried in a semiconductor body, for amplifying light of a given wavelength entering into and exiting from the body respectively at first and second mutually opposed facets of the body, the semiconductor optical amplifier structure containing an active region having a cross-section whose width and height differ from each other by a factor of less than about 2, the active region having input and output ends that are buried in the body so that each of first and second mutually opposite longitudinal extremities of the active region terminates within the body at a respective distance equal to at least about ten of the given wavelengths, as measured in the body, from the respective first and second mutually opposed facets of the body.

2. In an optical communication system, the structure recited in claim 1 in which the body is essentially indium phosphide.

3. In an optical communication system, the optical amplifier structure of claim 1 in which the distance is at least about 30 times greater than the given wavelength.

4. A fiber optic communication system comprising:
   (a) a first semiconductor optical amplifier structure in accordance with the structure recited in claim 1;
   (b) a first optical fiber positioned for propagating the light from a first remote location to the first edge of the body; and
   (c) a second optical fiber positioned for propagating the light exiting from the second edge of the body to a second remote location.

5. A fiber optic communication system according to claim 4 further comprising:
   an optical source positioned for supplying, to the first fiber, the light at the first remote location; and an optical detector positioned for receiving, from the second fiber, the light at the second remote location.

6. A fiber optic communication system according to claim 4 further comprising:

an optical source positioned for supplying, to the first fiber, the light at the first remote location; and a second semiconductor optical amplifier structure, substantially identical to the first structure, positioned for receiving, from the second fiber, the light at the second remote location.

7. A system according to claim 4 further comprising an electrical current drive connected to the optical amplifier structure.

8. An optical communication system comprising:

(a) first and second optical amplifier structures, each in accordance with the structure recited in claim 1;

(b) an optical filter adapted to receive light emanating from the first amplifier structure via first optical coupling means; and (c) an optical isolator adapted to receive light emanating from the optical filter via second optical coupling means and to deliver light to the second amplifier structure via third optical coupling means.

9. The system recited in claim 8 further comprising:

(a) a first optical fiber adapted for propagating the light from a first remote location to the first optical amplifier structure; and (b) a second optical fiber adapted for propagating the light exiting from the second optical amplifier to a second remote location.

10. The system recited in claim 9 further comprising an optical source positioned at the first remote location for supplying light to the first fiber, and an optical detector positioned at the second remote location for receiving light from the second fiber.

* * * * *